United States Patent [19]

Pagano

[11] Patent Number: 5,453,683
[45] Date of Patent: Sep. 26, 1995

[54] CONTINUITY TESTER

[76] Inventor: Biagio Pagano, 4482 Beauvoir Street, Saint-Leonard, Que., Canada, H1R 1V4

[21] Appl. No.: 141,222

[22] Filed: Oct. 26, 1993

[30] Foreign Application Priority Data

Sep. 16, 1993 [CA] Canada .................................. 2106234

[51] Int. Cl.$^6$ .................................................. G01R 1/04
[52] U.S. Cl. .......................................... 324/156; 324/556
[58] Field of Search ...................................... 324/156, 550, 324/555, 556; 361/823; 340/652–654

[56] References Cited

U.S. PATENT DOCUMENTS

| | | | |
|---|---|---|---|
| 1,734,226 | 11/1929 | MacGahan et al. | 324/156 |
| 1,778,883 | 10/1930 | Brach | 324/556 |
| 2,023,916 | 12/1935 | Dante | 324/550 |
| 2,478,999 | 8/1949 | Briseno | 324/550 |
| 3,987,364 | 10/1976 | MacCormack | 324/555 |
| 4,027,236 | 5/1977 | Stewart | 324/556 |
| 4,942,356 | 7/1990 | Ellingen et al. | 324/156 |

FOREIGN PATENT DOCUMENTS

| | | | |
|---|---|---|---|
| 2661552 | 10/1991 | France | 324/550 |
| 2224579 | 5/1990 | United Kingdom | 324/550 |

*Primary Examiner*—Maura K. Regan
*Attorney, Agent, or Firm*—Eric Fincham

[57] ABSTRACT

The present invention provides a continuity tester suitable for testing different types of devices and circuits wherein first and second members are hingedly connected together, the first and second members each having an electrically conductive surface element associated therewith, the arrangement being such that the conductive surface element of the first member is connected to a negative side of a test circuit and the conductive surface element of the second member is connected to the positive of a test circuit and the first and second members then assume different angles with respect to each other to enable many different devices to be tested through manipulation of the first and second members.

9 Claims, 4 Drawing Sheets

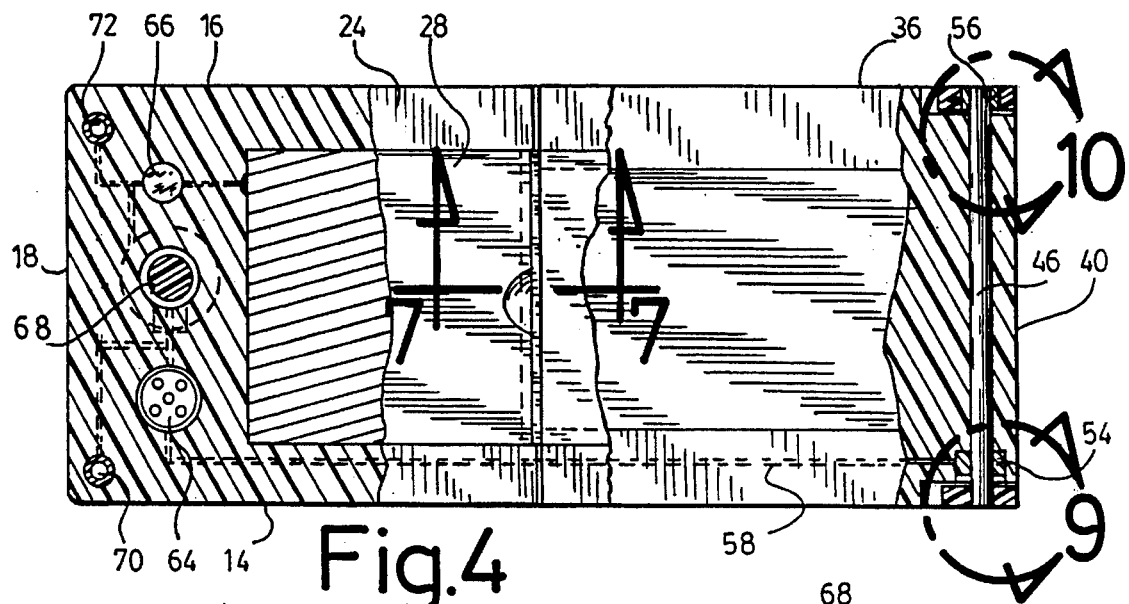
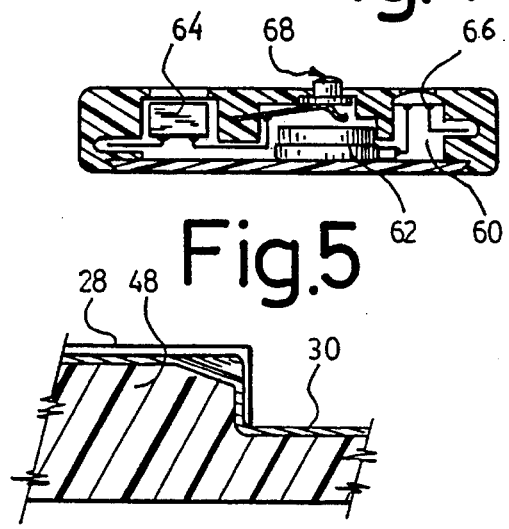
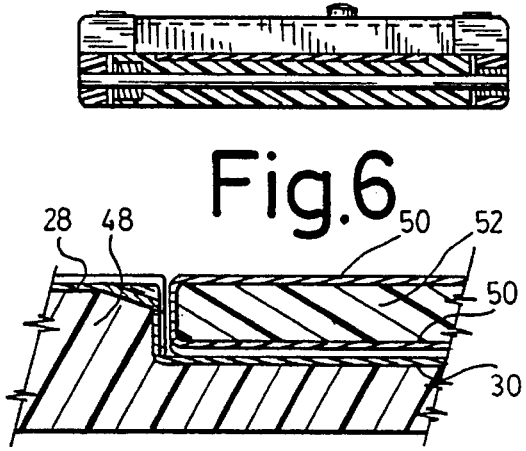
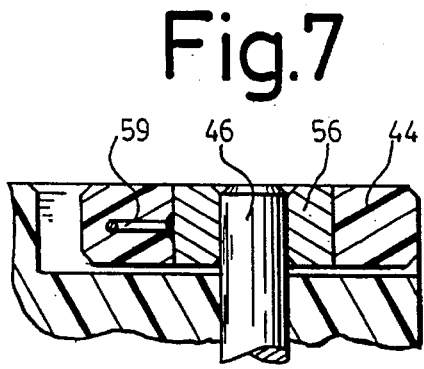
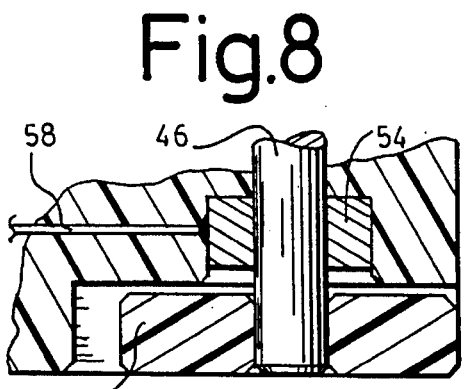

CONTINUITY TESTER

BACKGROUND OF THE INVENTION

The present invention relates to a continuity tester and more particularly, relates to a continuity tester for testing many different types of devices and circuits.

The art of continuity testers is an old one and as such, many different continuity testers have been previously proposed. These testers have been utilized to test fuses, bulbs, etc. Many of the prior art continuity testers have been suitable only for a limited use and/or have been incorporated with other devices such as flashlights. Also, many such testers have been designed for use with high voltage AC test circuits.

SUMMARY OF THE INVENTION

It is an object of the present invention to provide a continuity tester which is a compact unit and which may be utilized for verifying many different types of circuits.

It is a further object of the present invention to provide a portable continuity tester which is adjustable to provide maximum flexibility for testing various types of circuits and is simple to use, even for those with little knowledge of electric devices.

It is a still further object of the present invention to provide a continuity tester which is adaptable to test many different types of circuits and which is suitable for use by people lacking the physical capability to manipulate the tester.

According to one aspect of the present invention, there is provided a continuity tester which comprises first and second members which are hingedly connected together. Each of the first and second members has an electrically conductive surface element associated therewith. The tester includes an electrical series test circuit which includes a DC power source, a current limiting resistance and indicating means. The arrangement of the tester is such that the conductive surface element of the first member is connected to a negative side of the circuit and the conductive surface element of the second member is connected to the positive side of the DC circuit. The first and second members can then assume different angles with respect to each other whereby many different devices can be tested through suitable manipulation of the first and second members.

In a further aspect of the present invention, there is provided a continuity tester which has a base portion with at least one pair of opposed sides and having a raised portion intermediate the pair of opposed sides to thereby provide first and second test areas on an upper horizontal surface of the base portion, the test areas being separated by the raised portion, the test surfaces each having an electrically conductive member on the upper horizontal surfaces thereof, the raised portion having an electrically conductive member on at least one substantially vertical side surface thereof, and an electrical series test circuit which includes a DC power source, a current limiting resistance, and indicating means.

In greater detail, in the embodiment utilizing the first and second hingedly connected members, and as previously mentioned, each of the members has a conductive surface element associated therewith. The members are connected together by a suitable hinge such that the members are rotatable with respect to each other and thereby permit the conductive surface elements to be placed in varying positions relative to each other and the device to be tested.

The tester will incorporate substantially conventional electric test circuit means and which would include a suitable DC power source, a current limiting resistance, indicating means, and allow for the use of probes and/or other testing members. The DC power source may conveniently comprise one or more batteries which may be housed in one of the hinged members.

The hinged members may be constructed in several different ways and the electrically conductive surface elements may be placed either on the interior or the exterior surfaces; thus, the relative movement of the two members to each other will be different depending on the precise arrangement. Likewise, the members may be similar or dissimilar in size as will be discussed in greater detail with respect to the preferred embodiments. It is preferred that the members be designed such that they can be folded about the hinge to form a compact portable package.

The device may be made of many suitable materials and conveniently, may be manufactured substantially of a suitable plastic material.

The continuity tester can test many different devices which are known in the art including, for example, fuses of all types, sizes and shapes including socket fuses, car fuses, etc. All types of lights and wires and indeed, any appliance or tool that has a continuous circuit which needs to be verified for a short circuit can be tested.

The device will include indicating means and such indicating means can include both visual and/or acoustical indicators. Thus, one could use a plurality of light emitting diodes or similar devices for a visual indicator.

In association with the capability of testing various devices through manipulation of the hingedly connected members, the tester may also include means for testing by means of probes or the like (alligator clips) as is known in the art. To this end, there may be provided first and second sockets for receiving one end of the probe members and which would operate in a conventional manner using the DC test circuit of the invention. The continuity tester may also conveniently include space for storing the probes in the interior of one of the members.

In a further embodiment, there may be provided a continuity tester which does not employ the hingedly connected members, but rather is a fixed unit which may be suitable for use by physically challenged people. In such an embodiment, the continuity tester could be formed to have a base portion with an upper surface being divided into two separate test areas by a raised portion. Each of the separate areas would have, on the upper surface of the base portion, an electrically conductive element and in one variation, one of the areas may employ a pair of such elements. The raised portion would also have an electrically conductive element located on a side wall thereof. The advantage of this arrangement is that the electrically conductive element on the side of the raised portion and the electrically conductive element on the upper surface of the base portion provide convenient means for testing devices such as light bulbs. Preferably, the raised portion has a variable height or in other words, is sloped to provide a ramp like structure which is convenient for testing light bulbs and socket fuses of varying sizes and configurations.

Having thus generally described the invention, reference will be made to the accompanying drawings illustrating embodiments thereof, in which:

BRIEF DESCRIPTION OF THE DRAWINGS

FIG. 4 is a sectional view taken along the lines 4—4 of FIG. 2;

FIG. 5 is a sectional view taken along the lines 5—5 of FIG. 3;

FIG. 6 is a sectional view taken along the lines 6—6 of FIG. 3;

FIG. 7 is a sectional view taken along the lines 7—7 of FIG. 4;

FIG. 8 is a sectional view taken along the lines 8—8 of FIG. 1;

FIG. 9 is a detailed view of that portion indicated by arrow 9 in FIG. 4;

FIG. 10 is a detailed view of that portion indicated by arrow 10 of FIG. 4;

DETAILED DESCRIPTION OF THE INVENTION

Figure 1:
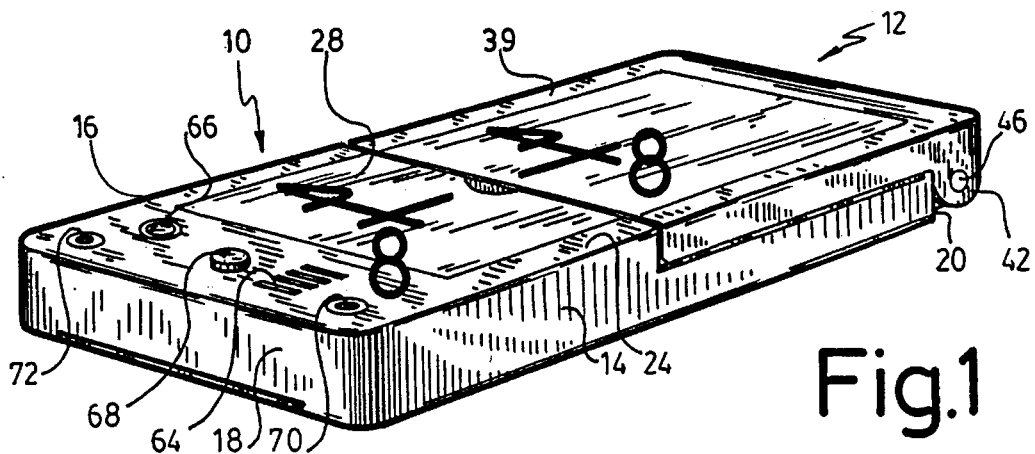
FIG. 1 is a perspective view of one embodiment of a continuity tester according to the present invention.

Referring to the drawings in greater detail, and by reference characters thereto, the tester illustrated in FIGS. 1 to 10 comprises a first member 10 and a second member 12 which are hingedly connected together.

First member 10 is defined by a pair of opposed side walls 14 and 16 and end walls 18 and 20. A bottom surface 22 is substantially planar while an upper surface is of a stepped configuration having a first section 24 with a second section 26 lying in a different horizontal plane from first section 24. Electrically conductive elements 28 and 30 are mounted on the top surfaces of sections 24 and 26 respectively.

Second member 12 is of an overall generally rectangular configuration and is defined by a pair of side walls 34 and 36 and opposed end walls 38 and 40. Both an upper surface 39 and lower surface 41 are substantially planar. Proximate end wall 40 are a pair of tabs 42 and 44 which have an aperture formed therein to receive a hinge pin 46. Hinge pin 46 passes through tabs 42 and 44 and the body portion 48 of first member 10 to thereby secure first member 10 and second member 12 together.

Second member 12 has a conductive element 50 on both the upper and lower surfaces 39 and 41 respectively of insulating body 52.

As may be seen in FIGS. 9 and 10, hinge pin 46 has arranged thereabout, at either end, an electrically conductive bushing 54 and 56. Bushings 54 and 56 are connected to wires 58 and 59 respectively which form a part of the electrical test circuit. Thus, in the illustrated embodiment, wire 58 is in electrical communication with bushing 54 such that a continuous electrical circuit is permitted to pass through pin 46 to bushing 56 and then to wire 59. In turn, wire 58 is connected to conductive element 28 and 30 while wire 59 will be connected to conductive element 50 of second member 12.

As may be seen from FIG. 5, member 10 has a cavity 60 in which is housed batteries 62, and an audio indicator 64 and a visual indicator 66. A test button 68 is provided for activation of a test circuit in a conventional manner. The continuity tester can also include a pair of sockets 70 and 72 which are adapted to receive probes 74 as is well known in the art. Probes 74 may conveniently be stored within cavity 60 of member 10.

Figure 2:
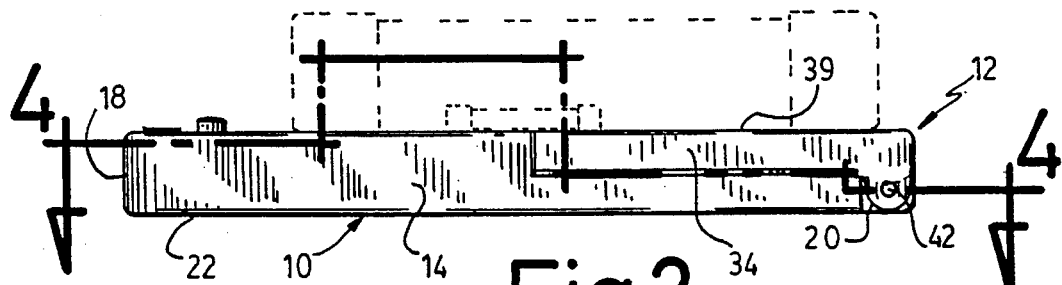
FIG. 2 is a side elevational view of the tester of FIG. 1.

In operation, the device can be used in several different manners for testing. Thus, as shown in FIG. 2, flat objects such as fuses may be tested by placing one of the contacts on electrically conductive element 28 of first member 10 with the upper conductive element 50 of member 12. As indicated in dotted lines in FIG. 2, this would be suitable for testing fuses of all sizes.

Figure 3A:
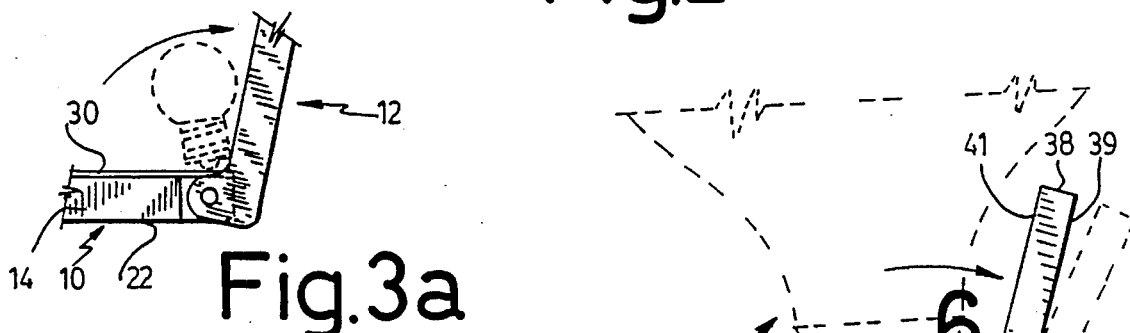
FIG. 3a is a detailed view similar to FIG. 3 showing operation of the tester.
Figure 3:
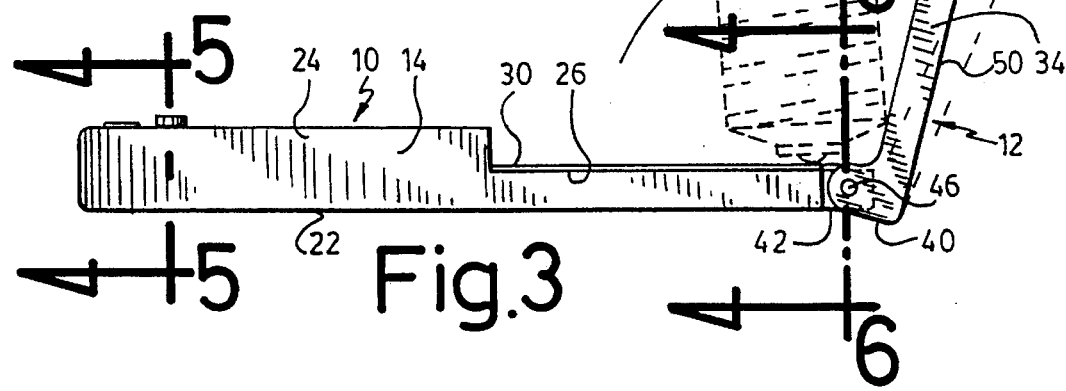
FIG. 3 is a side elevational view similar to FIG. 2 showing operation of the tester.

As shown in FIGS. 3 and 3a, member 12 may be rotated about hinge 46 to open the same to test other objects such as light bulbs and socket fuses. In this embodiment, one of the contact is placed in physical contact with conductive element 30 of member 10 and the other side portion placed in contact with element 50 of second member 12 when the same has been rotated to a semi open position. The rotation of member 12 with respect to member 10 permits one to vary the angle to that best suited for testing the particular device.

Figure 14:
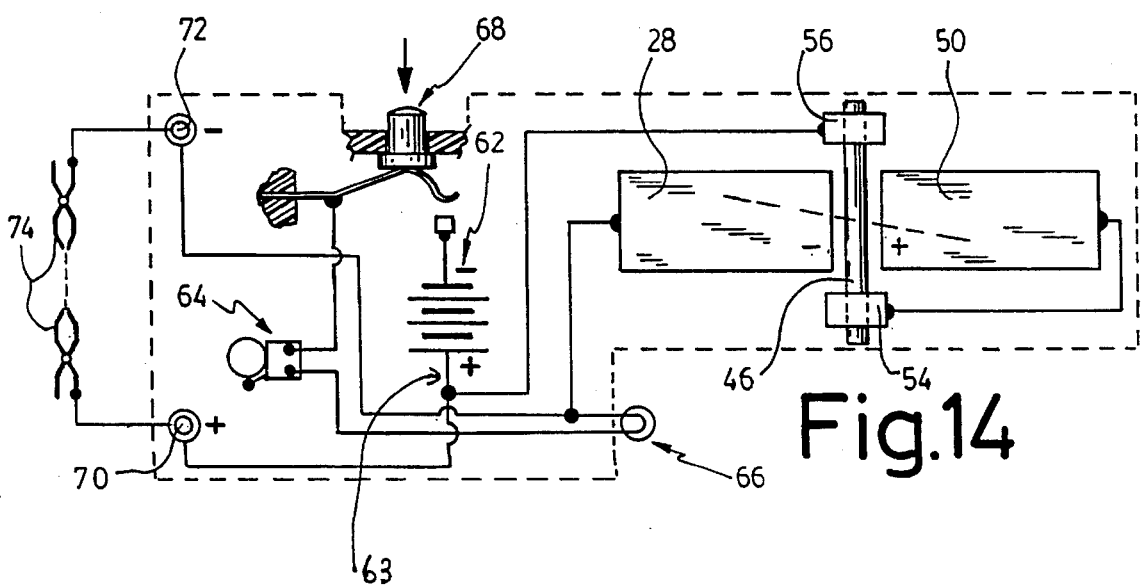
FIG. 14 is an electrical schematic showing a typical electric test circuit.

Referring to FIG. 14, there is shown a typical circuit which can be employed in any of the embodiments discussed herein. It will be understood that the circuit can be modified and that the circuit shown, although using reference numerals realized in FIGS. 1 to 9, the circuit does not correspond exactly to the physical location of the component shown in FIGS. 1 to 9. As shown in FIG. 14, a resistance 63 is provided in the series circuit.

Figure 11:
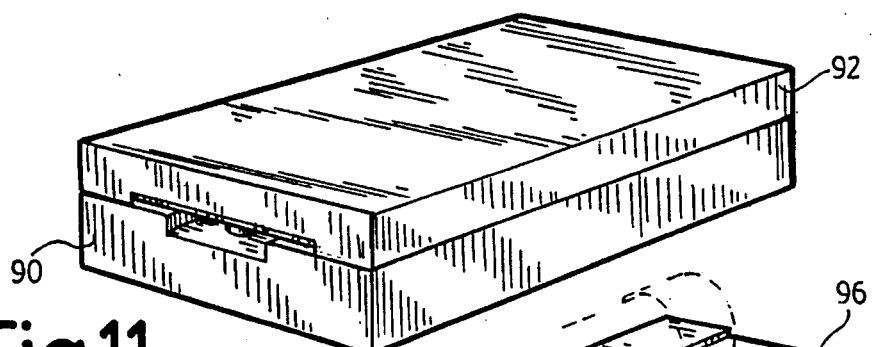
FIG. 11 is a perspective view of a further embodiment of the present invention.
Figure 12:
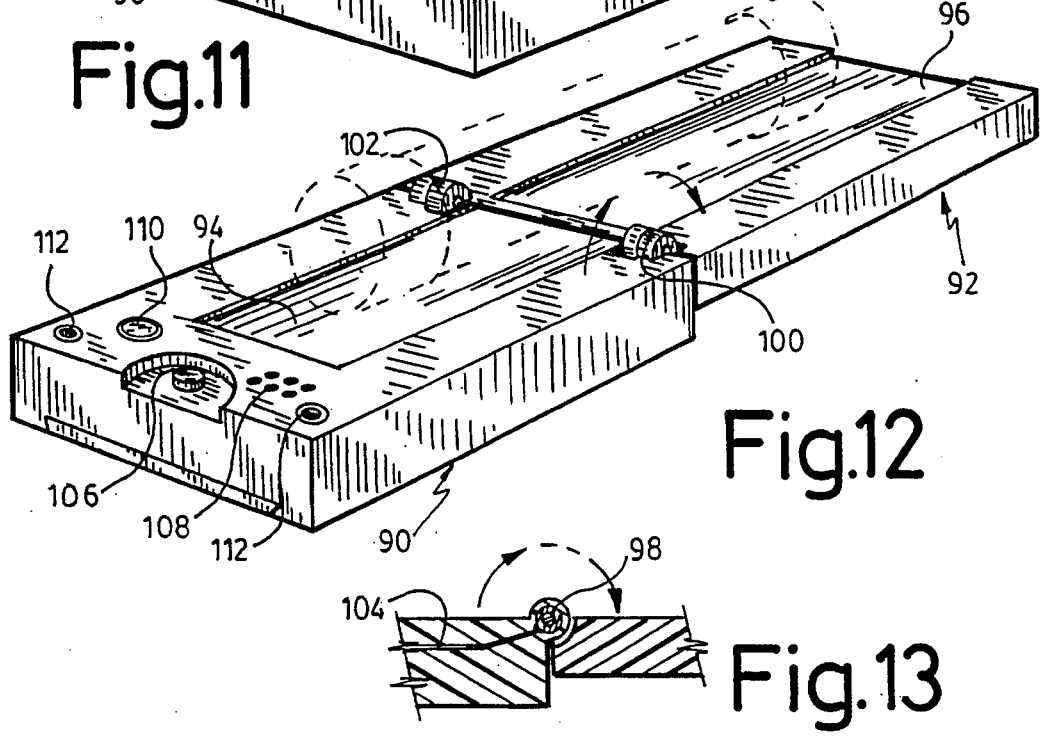
FIG. 12 is a perspective view of the tester of FIG. 11 in an open position.
Figure 13:
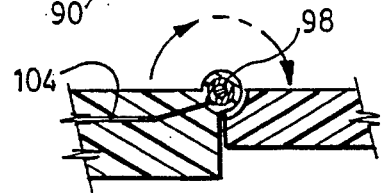
FIG. 13 is a detailed view of the hinge portion of the tester of FIG. 12.

A further embodiment illustrated in FIGS. 11 to 13 has first and second members 90 and 92 respectively, first member 90 has an electrically conductive element 94 associated therewith and second member 92 has an electrically conductive element 96. A hinge member 98 connects first and second members 90 and 92 while conductive bushings 100 and 102 operate to connect wire 104 as shown in FIG. 13 and to maintain continuity of the circuit. As in the previously described embodiment, there may be provided a test push button 106, an audio indicator 108, a light indicator 110 and a pair of plug sockets 112.

As will be noted, in this embodiment, electrically conductive elements 94 and 96 are slightly recessed within the surfaces of members 90 and 92 as is test push button 106 so as to avoid shorting when the tester is closed. The device operates in a similar manner to that of the previously described embodiments and as is shown in dotted lines in FIG. 12, a fuse member can conveniently be tested when the device is fully open. Otherwise, members 90 and 92 may be rotated with respect to each other to test other devices.

Figure 16:
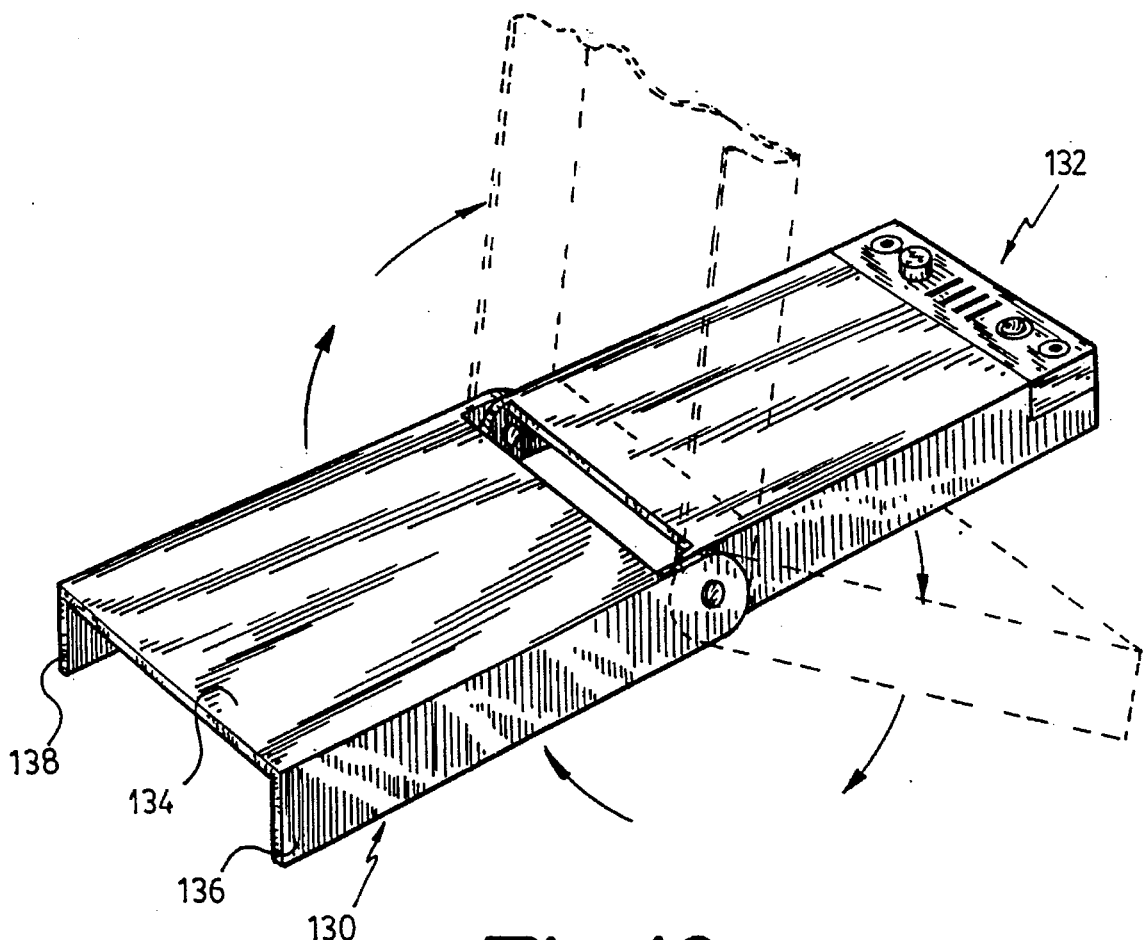
FIG. 16 is a perspective view of a still further embodiment according to the present invention.

In the embodiment of FIG. 16, a similar arrangement to that previously described is shown. Thus, one has a first member 130 and a second member 132. In this instance, first member 130 has a base portion 134 with a pair of walls 136 and 138 extending from marginal edges thereof. The arrangement is such that second member 132 will fit within the area defined by base 134 and walls 136 and 138 to provide a compact unit. Again, electrically conductive surface elements are provided and the testing would proceed in a manner similar to that previously described. It will be noted that the surface elements, in this instance, could be provided on the outwardly facing surfaces (upper surfaces as seen in FIG. 16) such that when the device is in a folded position, the conductive surfaces are remote from each other. Also, in this embodiment, a storage compartment may be provided for storage of probes and/or other purposes. Naturally, such a storage compartment could also be utilized in the other embodiments.

Figure 15:
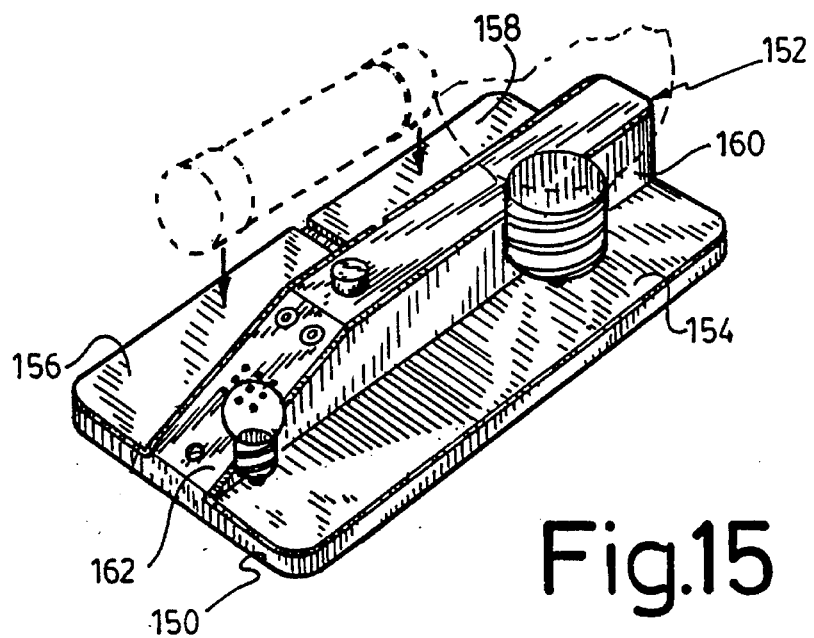
FIG. 15 is a perspective view of a further embodiment of a tester according to the present invention.

The continuity tester of FIG. 15 is adapted for use in a non-rotating manner and is particularly suited for physically challenged people. In this embodiment, the tester has a base 150 with a raised portion 152 dividing the base into two separate surface areas. On one of these surface areas, there is provided an electrically conductive element 154 which covers the entire upper surface of this area. The other has a pair of electrically conductive elements 156 and 158 while raised portion 152 has electrically conductive elements 160 on the side thereof. It will be noted that raised portion 152 has an area thereof which is sloped or in other words, has a ramp like configuration. As is shown in dotted lines in FIG. 15, elements 156 and 158 will be of opposite polarity and thus, are suitable for testing devices such as fuses. Elements 154 and 160 are also of opposite polarities and may be used for testing devices such as bulbs and in this respect, it will be noticed that the sloping portion 162 is particularly suited for testing different sizes of bulbs. This type of continuity tester could also be adapted to be attached to a surface for greater ease of use.

It will be understood that the above described embodiments are for purposes of illustration only and that changes and modifications may be made thereto without departing from the spirit and scope of the invention.

What is claimed is:

1. A continuity tester suitable for testing the continuity of an electric circuit comprising first and second plate-like members each member having first and second opposed surfaces, each of said first and second members having an electrically conductive surface element mounted on at least one of said opposed surfaces, hinge means connecting an end of each said first and second members said hinge means including an electrically conductive hinge pin, whereby said electrically conductive surface elements of said first and second members can be rotated through at least 180° with respect to each other from a first position wherein said electrically conductive surface elements lie substantially adjacent each other and in the same plane to a second position wherein said electrically conductive surface elements are removed from each other and lie in substantially the same plane, an electrical series test circuit including a DC power source, a current limiting resistance and indicating means, said electrically conductive surface element of said first member being connected to a negative side of said electrical series test circuit, said electrically conductive surface element of said second member being connected to a positive side of said electrical series test circuit, said first and second electrically conductive surface elements being electrically connected through said electrically conductive hinge pin.

2. The continuity tester of claim 1 wherein said first and second members are hinged such that said members can rotate through substantially 360° with respect to each other.

3. The continuity tester of claim 2 wherein one of said members has a recessed portion to receive the other of said members when in a closed position.

4. The continuity tester of claim 2 wherein said first member has a stepped configuration, the arrangement being such that said second member fits within the stepped portion of said first member.

5. The continuity tester of claim 4 wherein said electrically conductive surface element of said first element lies on both upper surfaces of said stepped first member, said second member having said electrically conductive surface member on a face thereof adjacent to said first member.

6. The continuity tester of claim 2 wherein said electrically conductive surface elements of both said first and second members are arranged such that when said members are folded together in a storage position, said elements are on outwardly facing surfaces remote from each other.

7. A continuity tester suitable for testing the continuity of an electric circuit having a base portion with at least one pair of opposed sides, a raised portion intermediate said pair of sides to thereby provide first and second test areas on an upper surface of the base portion, said first and second test areas being separated by said raised portion, said test areas each having an electrically conductive member on an upper surface thereof, said raised portion having an electrically conductive member on at least one side surface thereof, an electrical test circuit which includes a DC power source, a current limiting resistance and indicating means, one of said electrically conductive members being connected to a negative side of said test circuit and the other of said conductive members being connected to a positive side of said test circuit, said raised portion having a sloped ramp like configuration.

8. The continuity tester of claim 7 wherein one of said test areas has a pair of electrically conductive members on an upper surface thereof, each of said pair of electrically conductive members being of opposite polarity.

9. The continuity tester of claim 7 wherein said base portion is securable to a fixed surface.

\* \* \* \* \*